(12) United States Patent
Loh et al.

(10) Patent No.: US 6,961,915 B2
(45) Date of Patent: Nov. 1, 2005

(54) DESIGN METHODOLOGY FOR DUMMY LINES

(75) Inventors: William M. Loh, Fremont, CA (US); Benjamin Mbouombouo, San Jose, CA (US); Peter J. Wright, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 198 days.

(21) Appl. No.: 10/290,019

(22) Filed: Nov. 6, 2002

(65) Prior Publication Data

US 2004/0088669 A1 May 6, 2004

(51) Int. Cl.⁷ .............................................. G06F 17/50
(52) U.S. Cl. .................. 716/9; 430/5; 716/8; 716/14; 716/10
(58) Field of Search ............................... 716/14, 8–10; 430/5

(56) References Cited

U.S. PATENT DOCUMENTS

| | | |
|---|---|---|
| 5,108,945 A | 4/1992 | Matthews |
| 5,965,940 A | 10/1999 | Juengling |
| 5,981,384 A | 11/1999 | Juengling |

OTHER PUBLICATIONS

"Chip–Level CMP Modeling and Smart Dummy for HDP and Conformal CVD Films", Liu, George Y. et al., Feb. 11–12, 1999, CMP–MIC Conference, pp. 120–127.

*Primary Examiner*—A. M. Thompson
(74) *Attorney, Agent, or Firm*—Sawyer Law Group LLP

(57) ABSTRACT

A method and system for designing a dummy grid in an open area of a circuit adjacent to at least one metal line comprising the circuits is disclosed. The method and system include patterning dummy lines in the dummy grid adjacent to metal signal lines, and patterning non-floating dummy lines in the dummy grid adjacent to metal power lines. The method and system further include varying sizes and spacing of the dummy lines in the respective columns of the dummy grid based on the distance between each column and the adjacent metal line, to achieve a balance between planarization and performance.

19 Claims, 4 Drawing Sheets

DESIGN METHODOLOGY FOR DUMMY LINES

FIELD OF THE INVENTION

The present invention relates to a design methodology for metal lines of integrated circuits, such as ASICS, and more particularly to a design methodology for placement and sizing of dummy lines in relation to signal lines.

BACKGROUND OF THE INVENTION

Integrated circuits are fabricated using optical photolithography in which a circuit design or layout is transferred to a semiconductor substrate. In transferring the layout, a mask is generally created for each layer of the integrated circuit design that reproduces the patterns of that layer. To fabricate a particular layer of the design, the corresponding mask is placed over the substrate and optically projected onto the surface of the substrate. The photolithography process is typically followed by an etch process during which the underlying substrate not covered or masked by the photoresist pattern is etched away, leaving the desired pattern in the substrate. This process is then repeated for each layer of the design.

Photolithography processes are capable of reaching submicron resolutions, and each new process technology introduced enables the fabrication of smaller device sizes, densities, and geometries. The ability to print highly dense circuit layouts having minimal device sizes is dependent on the existence of a highly planar surface on which shapes from the mask is transferred. The planarity of the surface, in turn, is dependent upon the layout of the metal lines comprising a circuit.

In conventionally design circuit layouts, large open areas are left on the substrate between the nearest parallel electrically isolated metal lines, which include signal and power lines. The open areas are random in size and have a wide variety of dimensions. When a dielectric layer, such as an oxide, is subsequently deposited over the metal lines and open areas, the difference in height or thickness between the metal lines and the flat surfaces produce an altitude difference in the top surface of the dielectric layer. The process that attempts to minimize or eliminate the different altitudes of the top surface of the dielectric layer in different areas of the metal line design layout is called dielectric planarization.

Another method, known as the damascene process, to make metal lines is to use photolithography to define metal areas on the dielectric layer followed by etching to produce trenches partially through the dielectric layer first. Metal is then deposited to fill these trenches in such a way that the metal forms a blanket layer above the dielectric layer. This new metal is then eliminated to expose the inlaid metal lines by a combined mechanical and chemical polishing step. This entire process is known as metal planarization.

One popular planarization approach is to modify the metal line layout design by requiring standardize spacing between the various metal features (See for example U.S. Pat. No. 5,981,384). This standardization is accomplished by adding electrically isolated dummy metal features in the open spaces, and/or by increasing the size of existing electrically unisolated metal lines to reduce the spacing between nearest parallel metal lines to the standardize spacing.

FIG. 1 is a top view of a conventional metal line layout in which standardized spacing between the signal lines and dummy lines are employed to increase planarization. The layout 10 includes a series of metal signal lines 12 patterned in parallel and a grid of dummy lines 14 patterned in an open space adjacent to the signal lines 12. The dummy lines 14 are typically patterned in columns parallel to the signal lines 12 with uniform length and width. The first column is located a distance (D) from the signal lines 12, and the dummy lines 14 are separated from one another by a uniform spacing ($S_d$), where $S_d$=D. Once all the metal lines 12 and 14 have been patterned, a dielectric layer (not shown) is deposited over the substrate, resulting in substantial planarization due to the uniform spacing between the electrically isolated dummy metal lines 14 and the metal signal lines 14 beneath the dielectric layer.

Although the standardized spacing modification enhances planarization, patterning the dummy lines 14 too close to a signal line 12 increases capacitance between the dummy lines 14 and the signal line 12. The increased capacitance can affect the signal line 12 by slowing the transmission speed of signals, thereby degrading overall performance of the integrated circuit. However, patterning the dummy lines 14 too far away from the signal lines 12 may lead to unacceptable uniformity and planarization.

Accordingly, what is needed is an improved methodology for designing dummy lines that achieves an appropriate balance planarization and performance.

SUMMARY OF THE INVENTION

The present invention provides a method and system for designing a dummy grid in an open area of a circuit adjacent to at least one metal line comprising the circuit. The method and system include patterning dummy lines in the dummy grid adjacent to metal signal lines, and patterning non-floating dummy lines in the dummy grid adjacent to metal power lines. The method and system further include varying sizes and spacing of the dummy lines in the respective columns of the dummy grid based on the distance between each column and the adjacent metal line.

According to the system and method disclosed herein, the varying sizes and spacings of the dummy lines achieves a balance between planarization and performance by minimizing capacitance between dummy lines and signal lines, and by maximizing capacitance between dummy lines and power lines.

DETAILED DESCRIPTION

The present invention relates to an improved design methodology for dummy lines. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
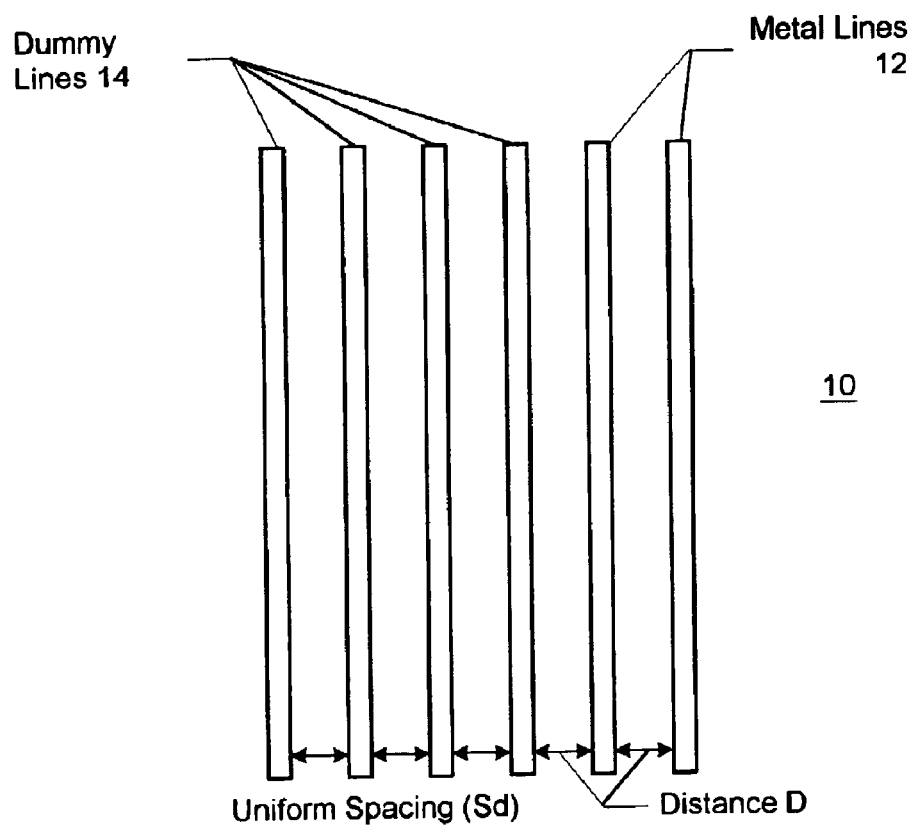
FIG. 1 is a top view of a conventional metal line layout in which standardized spacing between the signal lines and dummy lines are employed to increase planarization.
Figure 2:
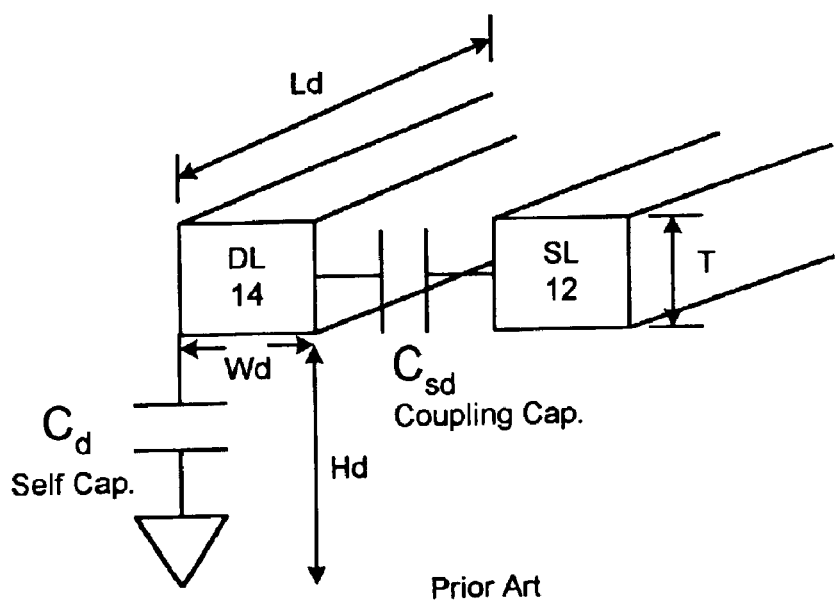
FIG. 2 is an isometric view of an example signal line and a dummy line patterned on some layer of a substrate.

FIG. 2 is an isometric view of an example signal line 12 and a dummy line 14 patterned on some layer of a substrate (not shown). The signal line 12 rises a particular thickness (T) above the surface of the substrate 16. As used herein, the thickness will be referred to as ΔT because the cross-section of the signal line may not have a uniform rectangle shape, but rather a trapezoid shape that varies along the length of the signal. The percentage of change in the thickness of the signal line must be fabricated to meet a minimum process variation limitation in order for the circuit to meet performance requirements.

Dummy lines 14 are patterned with a size of length (Ld) and width (Wd), and are conventionally patterned with a fixed density, i.e., where the spacing ($S_d$) and width (Wd) are uniform between all metal lines. Current design rules used to pattern dummy lines 14 assume that the dummy line length should be long (e.g., 200 microns). However, dummy lines 12 patterned with fixed size and density have a capacitance impact on the signal lines 12. The total or effective capacitance seen from the signal line is:

$$C_{eff} = C_{sd} \cdot C_d / (C_{sd} + C_d)$$

where $C_{sd}$ represents coupling capacitance and $C_d$ represents self capacitance of the dummy line 14. In some circuit designs where a uniform distance $S_d$ is used between the metal lines, $C_{eff}$ becomes too large and impacts the performance of the circuit.

The present invention provides an improved methodology for designing dummy lines 14 in which non-uniform sizes and densities for the dummy lines 14 are used to achieve an appropriate balance between planarization and circuit performance based on the process technology being used. The present invention is based on a recognition of the relationship between capacitance and the sizes and densities of the metal lines. From the equation above, first-order approximations of $C_{sd}$ and $C_d$, respectively, are:

$$C_{sd} \approx (\epsilon_0 k L_d T)/D$$

$$C_d \approx (\epsilon_0 k W_d L_d)/H_d$$

where $\epsilon_0$ is the vacuum permitivity and k is a dielectric constant. $C_{eff}$ can be minimized by minimizing $C_{sd}$ and $C_d$. $C_{sd}$ can be minimized by increasing the distance D. And $C_d$ can be minimized by reducing the size/dimension/area ($W_d$ and $L_d$) of the dummy line 14. According to the present invention, the tradeoff is to minimize area, perimeter, and spacing (in all x, y, z directions) of dummy lines 14 to neighboring signal lines 12. For area, the self-capacitance is approximately proportional to the area of the dummy line. For signal lines 12, one strategy is to make the dummy lines 14 appear as electrically floating as possible by having as little self capacitance associated with the dummy lines 14 as possible because the less capacitance, the less "grounded" the dummy lines 12 appear. Another strategy is ground the dummy lines to minimize cross-talk. These two strategies can be used to complement each other to achieve design requirements.

According to the present invention, either floating or non-floating dummy lines are patterned in dummy grids adjacent to one or more metal lines, and non-floating dummy lines are patterned adjacent to metal power lines. A non-floating dummy line is one that is connected to a power (VDD) line or a ground (VSS) line. The dummy lines used for the signal lines can either be floating or non-floating depends on the signal delay and cross-talk requirement of the adjacent signal lines. Whether floating or non-floating dummy lines are used, the sizes and spacing of the dummy lines 14 are varied in the respective columns of the dummy grid based on the distance of each column to the adjacent metal line 12.

Figure 3A:
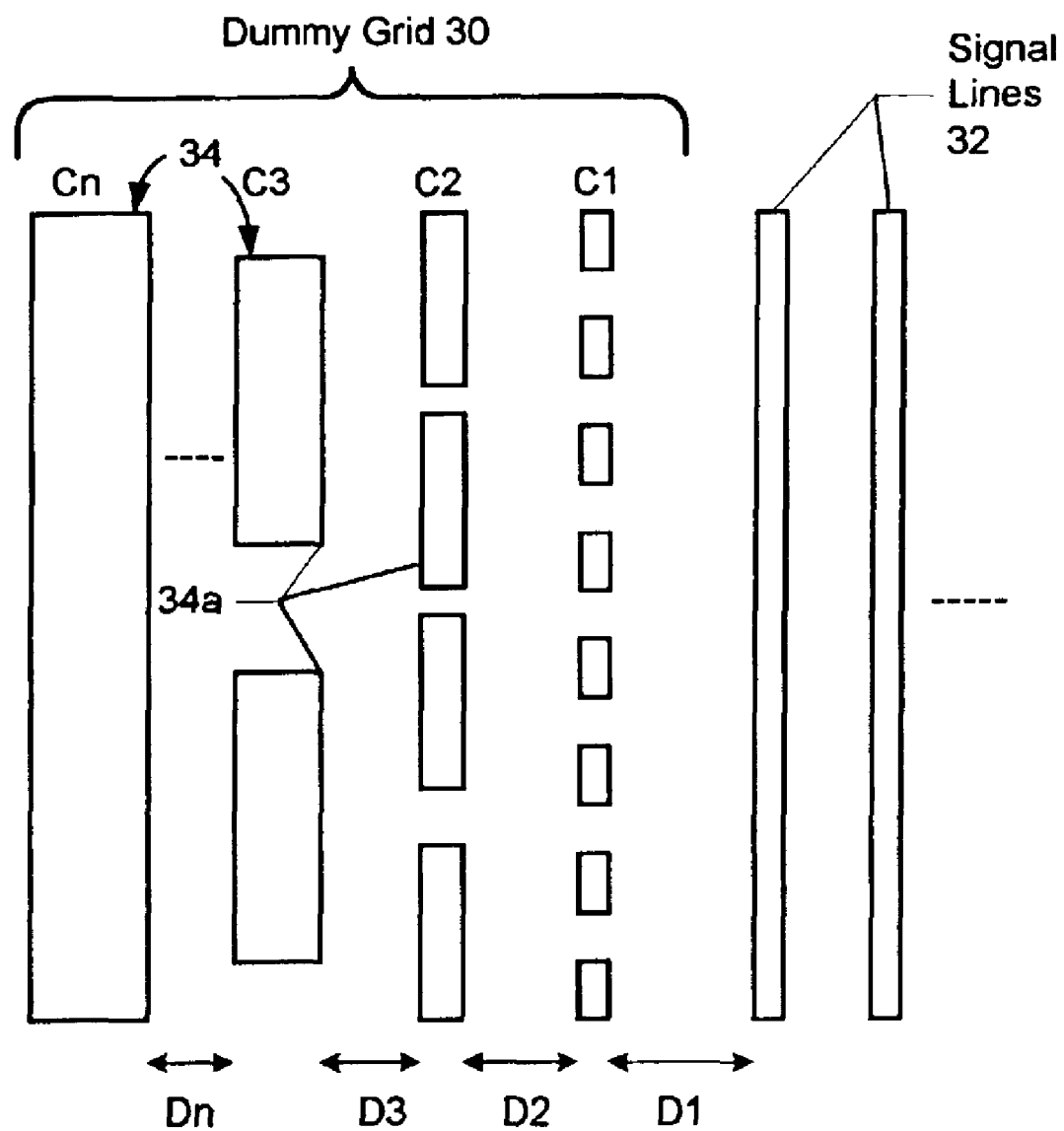
FIG. 3A is a top view of the design for a dummy grid located adjacent to a signal line in accordance with a preferred embodiment of the present invention.

FIG. 3A is a top view of the design for a dummy grid located adjacent to a signal line in accordance with a preferred embodiment of the present invention. A dummy grid 30 located adjacent to a signal line 32 is designed such that as columns (C1–Cn) decrease in distance from the signal line 32, both the density and the size of the dummy lines 34 are decreased with the distance. More specifically, the spacing ($S_d$) between each column (C1–Cn) increases, and the dummy lines 34 that would normally extend the length of the columns (C1–Cn) are partitioned into a larger number of segments 34a having decreasing size.

Figure 3B:
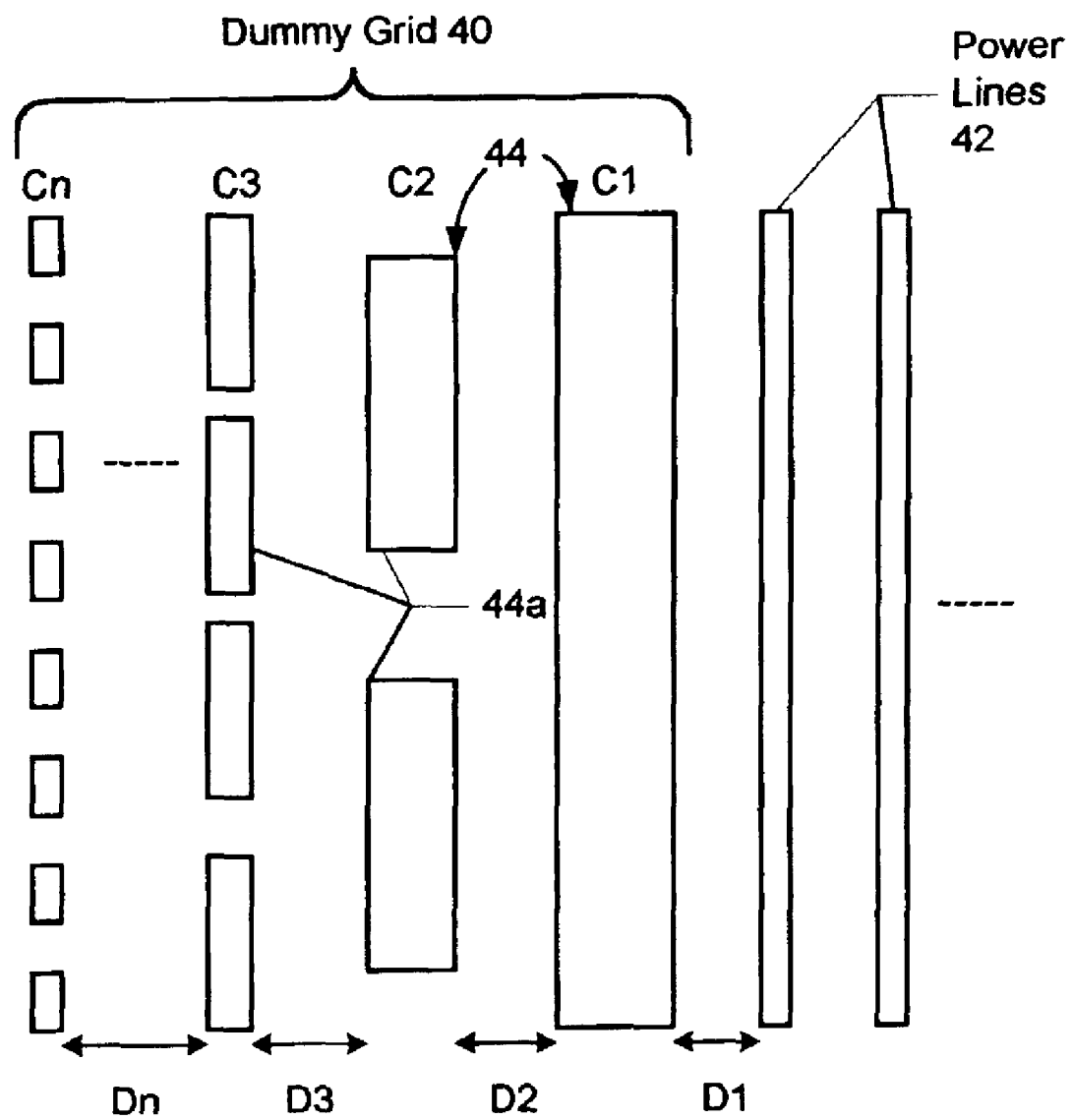
FIG. 3B is a top view of the design for a dummy grid located adjacent to a power line in accordance with a preferred embodiment of the present invention.

FIG. 3B is a top view of the design for a dummy grid located adjacent to a power line in accordance with a preferred embodiment of the present invention. A dummy grid 40 located adjacent to a power line 42 is designed with an opposite design methodology than described above because the goal is to increase coupling capacitances between power (VDD) and ground (VSS) (not shown). As columns (C1–Cn) decrease in distance from the power line 42 the density and the size of the dummy lines 34 are increased. More specifically, the spacing ($S_d$) between each column (C1–Cn) decreases, and the dummy lines 44 are coalesced into a smaller number of segments 44a having increasing size.

An additional bridging or shorting lines, in the same metal layer, between the power line 42 and dummy line C1, and also within dummy grid 40, provide another option to further increase the coupling capacitance.

Figure 4:
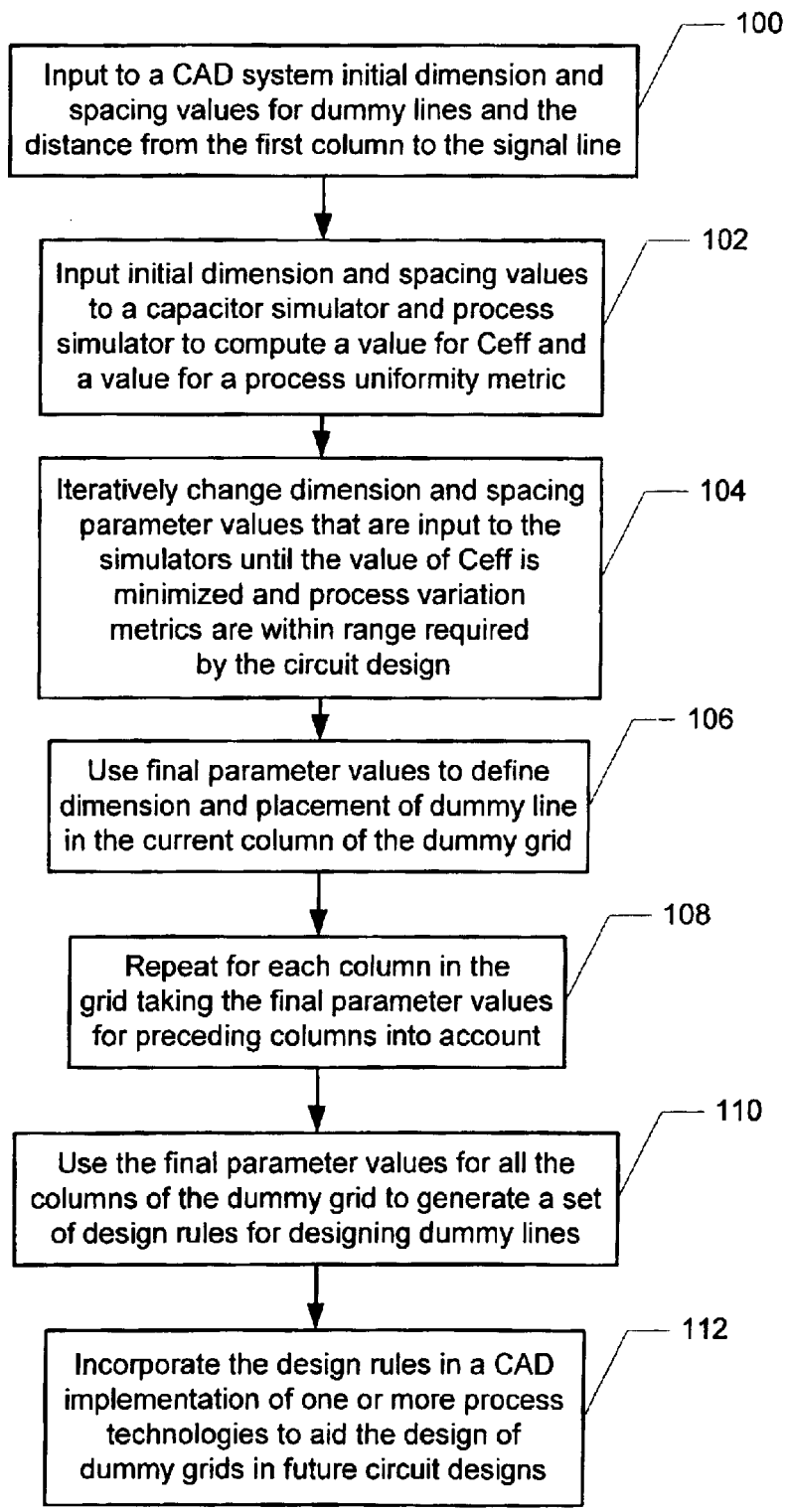
FIG. 4 is a flow diagram illustrating a process for implementing the dummy line design methodology into a process flow during the design of an integrated circuit.

FIG. 4 is a flow diagram illustrating a process for implementing the dummy line design methodology into a process flow during the design of an integrated circuit. The process begins in step 100 by inputting to a computer aided design (CAD) system initial dimension ($W_d$ and $L_d$) and spacing values for dummy lines in one or more columns of the grid, as well as the distance (D) from the first column to a signal line 32.

In step 102, the initial values are input to a capacitor simulator and process simulator along with other pertinent parameters to compute a value for $C_{eff}$ and a process uniformity metric. Capacitor simulators simulate the capacitance of a given design, and process simulators simulate the result of a masking process given a mask design and process parameters. Both types of simulators are well-known in the art and will not be explained in detail here. Using the same or similar equations as described above, the capacitor simulator is capable of outputting a value for $C_{eff}$. One output of the process simulator is a process uniformity metric, preferably ΔT, that describes the change in thickness of the signal line along its length due to process variations and systematic variations caused by layout. An example of systematic variation is a decrease of metal thickness when the spacings between neighboring lines are increased. Other uniformity metrics that may be used include change in width and the deviation of metal line from an ideal rectangular cross section to a trapezoidal cross section.

The goal is to minimize the dimension of the dummy lines ($W_d$ and $L_d$), while maximizing D and spacing ($S_d$) to reduce total effective signal-to-dummy capacitance, and at the same time minimizing the process variation indicated by the uniformity metric. This is accomplished in step 104 by iteratively changing dimension and spacing parameter values ($W_d$, $L_d$, D, and $S_d$) that are input to the simulators until a value of $C_{eff}$ is minimized and a value for the uniformity metric ($\Delta T$) is within a range required by the given circuit design is met.

According to the present invention, two approaches may be used to determine the size and placement of the dummy lines, 1) by addition, or 2) by subtraction. In the addition method, just a few dummy lines/segments 34 are initially defined in the dummy grid and more are added as the effect on $C_{eff}$ and the uniformity metric are observed. In the subtraction method, dummy lines are defined using traditional design methods and then slowly taken away and/or segmented as the effect on $C_{eff}$ and the uniformity metric are observed.

In integrated circuits, such as ASICS, metal lines are usually routed perpendicular to those in the layer above or below to form an interlayer crossing pattern. The same methodology described above can also be applied. Portions or all of the crossing dummy lines residing in the layers above or below a signal line can be taken away.

In step 106, the final parameter values are used to define the dimension and placement of dummy line/segments in the first column of the dummy grid. In step 108, the process is repeated for each column in the grid taking the final parameter values for preceding columns into account. This may be done by fixing the parameter values for the preceding columns and varying the parameters for the current column, or by varying the parameter values for the current column along with one or more the preceding columns simultaneously.

The following table illustrates an example of the balancing process achieved by the design methodology of the present invention:

TABLE I

| Parameters | Initial Param. Values | 1st Iteration | 2nd Iteration | Final Iteration |
|---|---|---|---|---|
| $S_d$ | 1 μ | 2 μ | 1.5 μ | 1.2 μ |
| $L_d$, | 100 μ | 20 μ | 5 μ | 60 μ |
| $W_d$ | 1 μ | .5 μ | .75 μ | .8 μ |
| $C_{eff}$ | 3 | 1 | 2 | 1.5 |
| $\Delta T$ | 10% | 3% | 20% | 15% |

The table shows a portion of the parameters input to the simulators, the initial values assigned to those parameters, and subsequent values assigned to the parameters when attempting to strike a balance between minimum $C_{eff}$ and a $\Delta T$ that meets process requirements. In this example, the final iteration of parameter values resulted in $C_{eff}$ being reduced by a factor of two from its initial value, while the process variation of the signal line as indicated by $\Delta T$ is such that the performance of the signal lines is not significantly impacted.

Referring again to FIG. 4, in step 110 the final parameter values for all the columns of the dummy grid are used to generate a set of design rules for designing dummy lines. In step 112, the design rules are incorporated into a CAD implementation of one or more process technologies to aid the design of dummy grids in future circuit designs.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A method for designing a dummy grid in an open area of a circuit adjacent to at least one metal line comprising the circuit, wherein the dummy grid includes one or more columns of dummy lines, the method comprising the steps of:
   (a) patterning floating dummy lines in the dummy grid if the adjacent metal line comprises a signal line;
   (b) patterning non-floating dummy lines in the dummy grid if the adjacent metal line is a power line; and
   (c) varying sizes and spacing of the dummy lines in the respective columns of the dummy grid based on distance between each column and the adjacent metal line to achieve a balance between planarization and performance.

2. The method of claim 1 further including the step of: if the dummy grid is located adjacent to the signal line, designing the dummy grid such that as the columns decrease in distance from the signal line, the size of the floating dummy lines is decreased and the spacing between the floating dummy lines is increased with the distance to minimize capacitance.

3. The method of claim 2 further including the step of: as the spacing between each column decreases, partitioning the floating dummy lines in the respective columns into a larger number of segments, where the segments in respective columns have decreasing size.

4. The method of claim 1 further including the step of: if the dummy grid is located adjacent to the power line, designing the dummy grid such that as the columns decrease in distance from the signal line, the size of the non-floating dummy lines is increased and the spacing between the non-floating dummy lines is decreased with the distance to maximize capacitance.

5. The method of claim 4 further including the step of: as the spacing between each column decreases, coalescing the non-floating dummy lines in the respective columns into a smaller number of segments, where the segments in respective columns have increasing size.

6. The method of claim 5 wherein the non-floating dummy lines are connected to a power (VDD) linen or a ground (VSS) line.

7. An integrated circuit, comprising:
   at least one metal line located adjacent to an open area in the circuit; and
   a dummy grid in the open area of a circuit adjacent to at least one metal line, the dummy grid including one or more columns of dummy lines patterned substantially parallel to the metal line, wherein sizes and spacing of the dummy lines in the respective columns of the dummy grid vary based on the distance between each column and the adjacent metal line to minimize capacitance, thereby achieving a balance between planarization and performance.

8. The integrated circuit of claim 7 wherein the metal line comprises a signal line, and the dummy grid comprises floating dummy lines.

9. The integrated circuit of claim 8 wherein the columns of the dummy grid decrease in distance from the signal line, and the size of the floating dummy lines decreases and the spacing between the floating dummy lines increases with the distance to minimize capacitance.

10. The integrated circuit of claim 9 wherein as the spacing between each column decreases, the floating dummy lines are partitioned in the respective columns into a larger number of segments, where the segments in respective columns have decreasing size.

11. The integrated circuit of claim 7 wherein the metal line comprises a power line, and the dummy grid comprises non-floating metal lines.

12. The integrated circuit of claim 11 wherein the columns of the dummy grid decrease in distance from the signal line, and the size of the non-floating dummy lines increases and the spacing between the non-floating dummy lines decreases with the distance to maximize capacitance.

13. The integrated circuit of claim 12 wherein as the spacing between each column decreases, the non-floating dummy lines are coalesced in the respective columns into a smaller number of segments, where the segments in respective columns have increasing size.

14. The method of claim 13 wherein the non-floating dummy lines are connected to a power (VDD) line or a ground (VSS) line.

15. A method for designing a dummy grid located adjacent to at least one signal line during the design of an integrated circuit, comprising the steps of:
   (a) inputting to a computer aided design (CAD) system initial dimension and spacing values for dummy lines in one or more columns of the grid, as well as the distance from the first column to the signal line;
   (b) inputting the initial dimension end spacing values to a capacitor simulator and process simulator to compute a value for $C_{eff}$ and a value for a process uniformity metric;
   (c) iteratively changing dimension end spacing parameter values that are input to the simulators until the value of $C_{eff}$ is minimized and the value for the uniformity metric indicates that a minimum process variation required by the circuit design is met;
   (d) using final parameter values to define dimension and placement of dummy line in a first column of the dummy grid;
   (e) repeating steps (b) and (c) for each column in the grid taking the final parameter values for preceding columns into account;
   (f) using the final parameter values for all the columns of the dummy grid to generate a set of design rules for designing dummy lines; and
   (g) incorporating the design rules in a CAD implementation of one or more process technologies to aid the design of dummy grids in future circuit designs.

16. The method claim 15 wherein step (c) further includes the step of: partitioning the dummy lines into segments.

17. The method of claim 16 further including the step of: determining size and placement of the dummy lines using addition method, whereby a set of dummy lines are initially defined in the dummy grid and more are added as an effect on $C_{eff}$ and the uniformity metric are observed.

18. The method of claim 16 further including the step of: determining size and placement of the dummy lines using subtraction method, whereby dummy lines are defined using traditional design methods and then taken away and/or segmented as an effect on $C_{eff}$ and the uniformity metric are observed.

19. The method of claim 16 further including the step of: determining size and placement of the dummy lines using subtraction method, whereby dummy lines are defined using traditional design methods and then taken away or segmented as an effect on $C_{eff}$ and the uniformity metric are observed.

* * * * *